(12) United States Patent
Lee et al.

(10) Patent No.: US 12,376,479 B2
(45) Date of Patent: Jul. 29, 2025

(54) DISPLAY DEVICE

(71) Applicant: LG Display Co., Ltd., Seoul (KR)

(72) Inventors: Geumyoung Lee, Gimpo-si (KR); JeongOh Kim, Goyang-si (KR); MyungJae Yoo, Paju-si (KR); SeongHo Kang, Seoul (KR)

(73) Assignee: LG Display Co., Ltd., Seoul (KR)

(*) Notice: Subject to any disclaimer, the term of this patent is extended or adjusted under 35 U.S.C. 154(b) by 511 days.

(21) Appl. No.: 17/946,347

(22) Filed: Sep. 16, 2022

(65) Prior Publication Data

US 2023/0217795 A1    Jul. 6, 2023

(30) Foreign Application Priority Data

Dec. 30, 2021    (KR) ........................ 10-2021-0192152

(51) Int. Cl.
| | |
|---|---|
| *H01L 27/32* | (2006.01) |
| *H10K 59/122* | (2023.01) |
| *H10K 59/124* | (2023.01) |
| *H10K 59/88* | (2023.01) |

(52) U.S. Cl.
CPC .......... *H10K 59/88* (2023.02); *H10K 59/122* (2023.02); *H10K 59/124* (2023.02)

(58) Field of Classification Search
None
See application file for complete search history.

(56) References Cited

U.S. PATENT DOCUMENTS

| | | | | |
|---|---|---|---|---|
| 2004/0121577 A1* | 6/2004 | Yu | ..................... | H01L 21/76852 |
| | | | | 438/622 |
| 2018/0123088 A1 | 5/2018 | Kim et al. | | |
| 2021/0399069 A1* | 12/2021 | Kim | ..................... | H10K 59/131 |

FOREIGN PATENT DOCUMENTS

| | | |
|---|---|---|
| KR | 10-2018-0047535 A | 5/2018 |
| KR | 10-2021-0001055 A | 1/2021 |

* cited by examiner

*Primary Examiner* — William C Trapanese
(74) *Attorney, Agent, or Firm* — Morgan, Lewis & Bockius LLP

(57) ABSTRACT

A display device includes a substrate including an active area and a non-active area which encloses the active area, a transistor on the substrate in the active area, a planarizing layer on the substrate and the transistor in the active area and the non-active area, a light emitting diode which is on the planarizing layer in the active area and includes an anode, an organic light emitting layer, and a cathode, a first conductive pattern on the planarizing layer in the non-active area, a second conductive pattern on the first conductive pattern in the non-active area and a plurality of dummy organic patterns which is disposed between the first conductive pattern and the second conductive pattern and is formed of the same material as the organic light emitting layer, wherein an air gap is disposed between the plurality of dummy organic patterns.

15 Claims, 8 Drawing Sheets

DISPLAY DEVICE

CROSS-REFERENCE TO RELATED APPLICATIONS

This application claims the priority of Korean Patent Application No. 10-2021-0192152 filed on Dec. 30, 2021, in the Korean Intellectual Property Office, the disclosure of which is incorporated herein by reference.

BACKGROUND

Technical Field

The present disclosure relates to a display device, and more particularly, to a display device which improves a reliability by blocking a moisture permeation path.

Discussion of the Related Art

Currently, as it enters a full-scale information era, a field of a display device which visually expresses electrical information signals has been rapidly developed and studies are continued to improve performances of various display devices such as thin-thickness, light weight, and low power consumption.

A representative display device may include a liquid crystal display device (LCD), a field emission display device (FED), an electro-wetting display device (EWD), and an organic light emitting display device (OLED).

Among them, an electroluminescent display device including an organic light emitting display device is a self-emitting display device so that a separate light source is not necessary, which is different from a liquid crystal display device. Therefore, the electroluminescent display device may be manufactured to have a light weight and a small thickness. Further, since the electroluminescent display device is advantageous not only in terms of power consumption due to the low voltage driving, but also in terms of color implementation, a response speed, a viewing angle, a contrast ratio (CR), it is expected to be utilized in various fields.

SUMMARY

Accordingly, embodiments of the present disclosure are directed to a display device that substantially obviates one or more of the problems due to limitations and disadvantages of the related art.

An aspect of the present disclosure is to provide a display device which blocks moisture permeation by means of an organic light emitting layer.

Another aspect of the present disclosure is to provide a display device with an improved reliability and an improved lifespan by blocking the moisture permeation.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a substrate including an active area and a non-active area which encloses the active area, a transistor on the substrate in the active area, a planarizing layer on the substrate and the transistor in the active area and the non-active area, a light emitting diode which is on the planarizing layer in the active area and includes an anode, an organic light emitting layer, and a cathode, a first conductive pattern on the planarizing layer in the non-active area, a second conductive pattern on the first conductive pattern in the non-active area and a plurality of dummy organic patterns which is disposed between the first conductive pattern and the second conductive pattern and is formed of the same material as the organic light emitting layer, wherein an air gap is disposed between the plurality of dummy organic patterns.

Other detailed matters of the exemplary embodiments are included in the detailed description and the drawings.

According to the present disclosure, in the non-active area, the moisture permeation by means of the organic light emitting layer is blocked.

According to the present disclosure, the moisture permeation on the side surface is blocked to improve the reliability of the display device and improve the lifespan.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
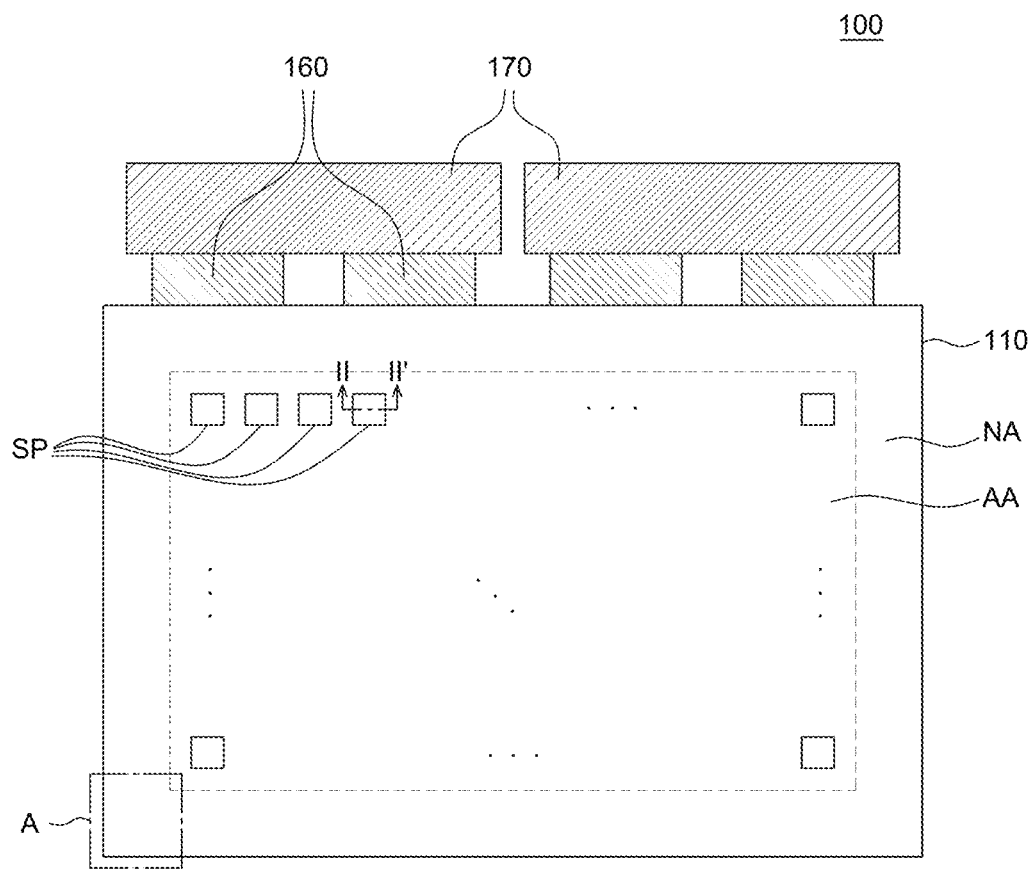
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

FIG. 1 is a plan view of a display device according to an exemplary embodiment of the present disclosure. For the convenience of description, in FIG. 1, among various components of the display device 100, only a substrate 110, a plurality of flexible films 160, and a plurality of printed circuit boards 170 are illustrated.

Referring to FIG. 1, the display device 100 according to the exemplary embodiment of the present disclosure includes a substrate 110, a plurality of flexible films 160, and a plurality of printed circuit boards 170.

The substrate 110 is a substrate which supports and protects a plurality of components of the display device 100. The substrate 110 may be formed of a glass or a plastic material having flexibility. When the substrate 110 is formed of a plastic material, for example, the substrate may be formed of polyimide (PI), but it is not limited thereto.

The substrate 110 includes an active area AA and a non-active area NA.

The active area AA is disposed at a center portion of the substrate 110 and images are displayed in the active area of the display device 100. In the active area AA, a display element and various driving elements for driving the display element may be disposed. For example, the display element may be configured by a light emitting diode including an anode, an organic light emitting layer, and a cathode, which will be described below. Further, various driving elements for driving the display element, such as thin film transistors, capacitors, or wiring lines may be disposed in the active area AA.

A plurality of sub pixels SP may be included in the active area AA. The sub pixel SP is a minimum unit which configures a screen and each of the plurality of sub pixels SP may include a light emitting diode and a driving circuit. The plurality of sub pixels SP may be intersections of a plurality of gate lines disposed in a first direction and a plurality of data lines disposed in a second direction which is different from the first direction. Here, the first direction may be a horizontal direction of FIG. 1 and the second direction may be a vertical direction of FIG. 1, but are not limited thereto. Each of the plurality of sub pixels SP may emit light having different wavelengths. For example, the plurality of sub pixels SP may include a red sub pixel, a green sub pixel, a blue sub pixel, and a white sub pixel.

The driving circuit of the sub pixel SP is a circuit for controlling the driving of the light emitting diode. For example, the driving circuit may include a switching transistor, a driving transistor, and a capacitor. The driving circuit may be electrically connected to signal lines such as a gate line and a data line which are connected to a gate driver IC and a data driver IC disposed in the non-active area NA.

The non-active area NA is disposed in a circumferential area of the substrate 110 and in the non-active area, images are not displayed. The non-active area NA is disposed so as to enclose the active area AA, but is not limited thereto. Various components for driving a plurality of sub pixels SP disposed in the active area AA may be disposed in the non-active area NA. For example, a driving IC, a driving circuit, a signal line, and a flexible film 160 which supply a signal for driving the plurality of sub pixels SP may be disposed.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels SP of the active area AA. One ends of the plurality of flexible films 160 are disposed in the non-active area NA of the substrate 110 to supply a data voltage to the plurality of sub pixels SP of the active area AA. In the meantime, even though four flexible films 160 are illustrated in FIG. 1, the number of flexible films 160 may vary depending on the design, but is not limited thereto.

A driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film technique, but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto.

In the meantime, the display device 100 may be configured by a top emission type or a bottom emission type, depending on an emission direction of light which is emitted from the light emitting diode.

According to the top emission type, light emitted from the light emitting diode is emitted above the substrate on which the light emitting diode is disposed. In the case of the top emission type, a reflective layer may be formed below the anode to allow the light emitted from the light emitting diode to travel above the substrate, that is, toward the cathode.

According to the bottom emission type, light emitted from the light emitting diode is emitted to below the substrate on which the light emitting diode is disposed. In the case of the bottom emission type, the anode may be formed only of a transparent conductive material and the cathode may be formed of the metal material having a high reflectance to allow the light emitted from the light emitting diode to travel below the substrate.

Hereinafter, for the convenience of description, the description will be made by assuming that the display device 100 according to an exemplary embodiment of the present disclosure is a bottom emission type display device, but it is not limited thereto.

Figure 2:
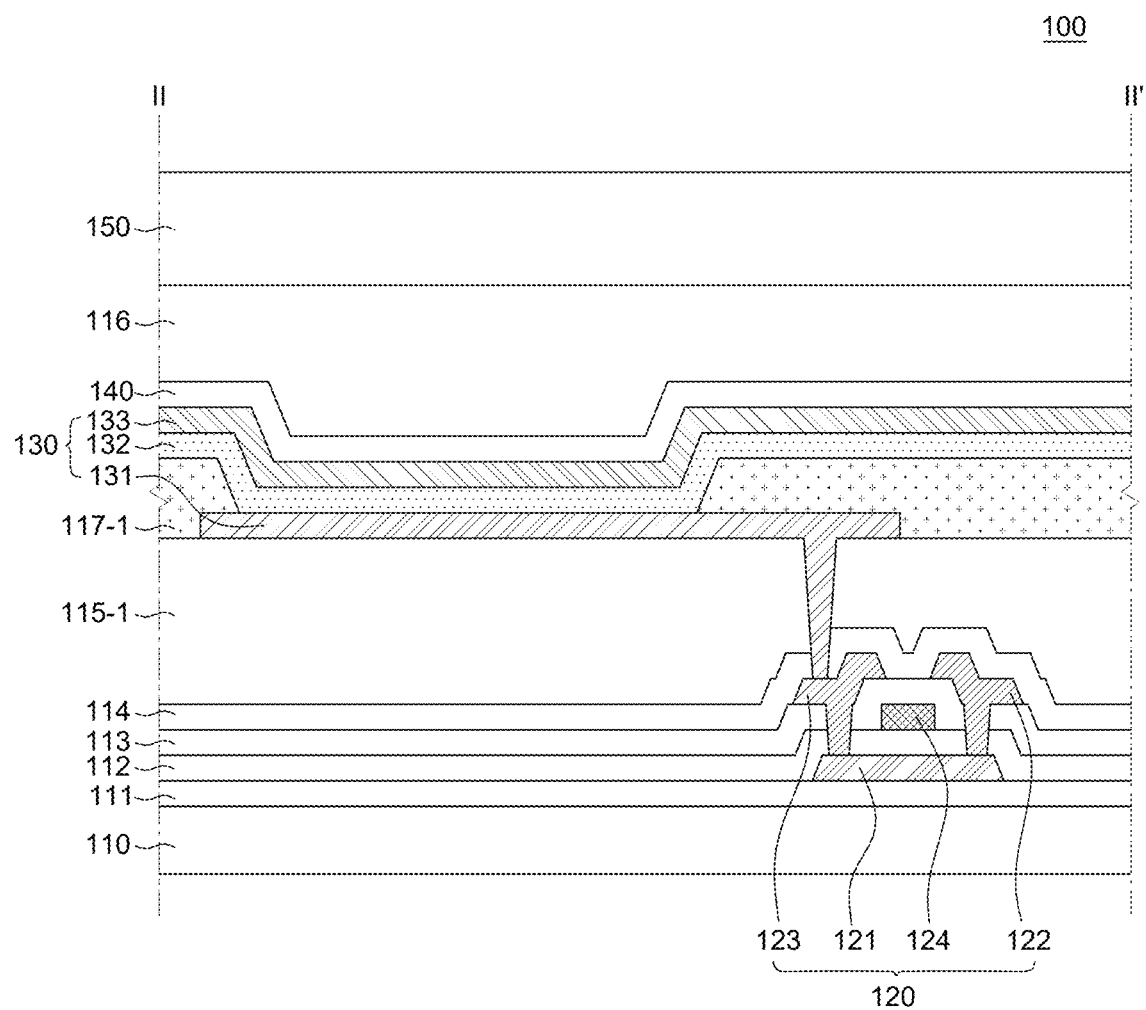
FIG. 2 is a cross-sectional view taken along the line II-II' of FIG. 1.

FIG. 2 is a cross-sectional view taken along the line II-II' of FIG. 1. In FIG. 2, for the convenience of description, only one sub pixel among the plurality of sub pixels SP is illustrated.

Referring to FIG. 2, the display device 100 includes a substrate 110, a buffer layer 111, a transistor 120, a gate insulating layer 112, an interlayer insulating layer 113, a passivation layer 114, a first planarizing layer 115-1, a first bank 117-1, a light emitting diode 130, a capping layer 140, an adhesive layer 116, and an encapsulation substrate 150.

The buffer layer 111 is disposed on the substrate 110. The buffer layer 111 may be formed by a single layer of silicon nitride SiNx or silicon oxide SiOx or a multilayer thereof. The buffer layer 111 may serve to improve adhesiveness between layers formed on the buffer layer 111 and the substrate 110 and block alkali components leaked from the substrate 110.

The transistor 120 is disposed on the buffer layer 111. The transistor 120 includes an active layer 121, a gate electrode 124, a source electrode 122, and a drain electrode 123. Here, depending on the design of the pixel circuit, the source electrode 122 may serve as a drain electrode and the drain electrode 123 may serve as a source electrode. The active layer 121 of the transistor 120 may be disposed on the buffer layer 111.

The active layer 121 may be formed of various materials such as polysilicon, amorphous silicon, or oxide semiconductor. The active layer 121 may include a channel region in which a channel is formed when the transistor 120 is driven and a source region and a drain region on both sides of the channel region. The source region refers to a portion of the active layer 121 which is connected to the source electrode 122 and the drain region refers to a portion of the active layer 121 which is connected to the drain electrode 123.

The gate insulating layer 112 is disposed on the active layer 121 of the transistor 120. The gate insulating layer 112 may be formed as a single layer of silicon nitride SiNx or silicon oxide SiOx or a multilayer thereof. In the gate insulating layer 112, a contact hole through which the source electrode 122 and the drain electrode 123 of the thin film transistor 120 are connected to the source region and the drain region of the active layer 121 of the thin film transistor 120 may be formed.

The gate electrode 124 of the transistor 120 may be disposed on the gate insulating layer 112. The gate electrode 124 may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof. The gate electrode 124 may be formed on the gate insulating layer 112 so as to overlap the channel region of the active layer 121 of the transistor 120.

The interlayer insulating layer 113 may be disposed on the gate insulating layer 112 and the gate electrode 124. The interlayer insulating layer 113 may be configured by a single layer of silicon nitride SiNx or silicon oxide SiOx or a multilayer thereof. A contact hole through which the source region and the drain region of the active layer 121 of the transistor 120 are exposed may be formed in the interlayer insulating layer 113.

The source electrode 122 and the drain electrode 123 of the thin film transistor 120 may be disposed on the interlayer insulating layer 113.

The source electrode 122 and the drain electrode 123 of the transistor 120 may be connected to the active layer 121 of the transistor 120 through the contact holes formed in the gate insulating layer 112 and the interlayer insulating layer 113. Therefore, the source electrode 122 of the transistor 120 may be connected to the source region of the active layer 121 through the contact holes formed in the gate insulating layer 112 and the interlayer insulating layer 113. Further, the drain electrode 123 of the transistor 120 may be connected to the drain region of the active layer 121 through the contact holes formed in the gate insulating layer 112 and the interlayer insulating layer 113.

The source electrode 122 and the drain electrode 123 of the transistor 120 may be formed by the same process. Further, the source electrode 122 and the drain electrode 123 of the transistor 120 may be formed of the same material. The source electrode 122 and the drain electrode 123 of the transistor 120 may be formed of a single layer or a multilayer formed of any one of molybdenum (Mo), copper (Cu), titanium (Ti), aluminum (Al), chrome (Cr), gold (Au), nickel (Ni), and neodymium (Nd) or an alloy thereof.

The passivation layer 114 may be disposed on the source electrode 122 and the drain electrode 123 to protect the source electrode 122 and the drain electrode 123. The passivation layer 114 is an insulating layer for protecting components below the passivation layer 114. For example, the passivation layer 114 may be configured by a single layer or a double layer of silicon oxide SiOx or silicon nitride SiNx, but is not limited thereto. Further, the passivation layer 114 may be omitted depending on the exemplary embodiment.

The first planarizing layer 115-1 may be disposed on the transistor 120 and the passivation layer 114 in the active area AA. As illustrated in FIG. 2, a contact hole may be formed in the first planarizing layer 115-1 to expose the drain electrode 123. The first planarizing layer 115-1 may be an organic material layer which planarizes an upper portion of the transistor 120. For example, the first planarizing layer 115-1 may be formed of an organic material such as acryl resin, epoxy resin, phenolic resin, polyamide resin, or polyimide resin, but it is not limited thereto.

In each of the plurality of sub pixels SP, the light emitting diode 130 may be disposed on the first planarizing layer 115-1. The light emitting diode 130 includes an anode 131, an organic light emitting layer 132, and a cathode 133. The anode 131 of the light emitting diode 130 is disposed on the first planarizing layer 115-1. The anode 131 is electrically connected to the transistor 120 by means of a contact hole formed in the first planarizing layer 115-1.

The anode 131 is formed of a transparent conductive layer. The transparent conductive layer may be formed of a material having a high work function such as indium tin oxide (ITO) or indium zinc oxide (IZO).

A first bank 117-1 is disposed on the anode 131 and the first planarizing layer 115-1 in the active area AA. The first bank 117-1 is disposed to cover an end of the anode 131 to expose a part of the anode 131. Since the bank 117 defines an emission area of the display device 100, the bank 118 may also be referred to as a pixel definition layer.

The organic light emitting layer 132 may be disposed on the anode 131.

The organic light emitting layer 132 of the light emitting diode 130 may be formed by laminating a hole layer, a light emitting layer, and an electron layer on the anode 131 in this order or a reverse order. Further, the organic light emitting layer 132 may include first and second emission structures which are opposite to each other with a charge generating layer therebetween. In this case, any one emission layer of the first and second emission structures generates blue light and the other one emission layer of the first and second emission structures generates yellow-green light so that white light may be generated by the first and the second emission structures. The white light generated in the organic light emitting layer 132 is incident onto a color filter disposed below the organic light emitting layer 132 to implement color images. When the color filter is disposed as described above, the color filter is disposed in an arbitrary location between the anode 131 and the substrate 110. In addition, individual organic light emitting layers 132 generate color light corresponding to individual sub pixels without having separate color filters to implement color images. For example, the organic light emitting layer 132 of a red sub pixel generates red light, the organic light emitting layer 132 of a green sub pixel generates green light, and the organic light emitting layer 132 of a blue sub pixel generates blue light.

The cathode 133 is disposed on the organic light emitting layer 132. Since the display device 100 is a bottom emission type display device, the cathode 133 is formed of a metal material having a high reflection efficiency. The cathode 133 of the light emitting diode 130 is disposed on the organic light emitting layer 132 so as to be opposite to the anode 131 with the organic light emitting layer therebetween.

The capping layer 140 is disposed on the light emitting diode 130. The capping layer 140 is formed to improve an optical characteristic of the light emitting diode 130. Further, the capping layer 140 protects the cathode 133 so as not to be oxidized or deteriorated. For example, the capping layer 140 is formed of an organic material or metal oxide including lithium fluoride (LiF). Further, the capping layer 140 is formed with a thickness of 100 Å to 5000 Å. As described above, when the capping layer 140 is formed, the luminous efficiency and the viewing angle of the light emitting diode 130 are improved so that the display quality is excellent. However, the capping layer 140 is not an essential component so that the capping layer 140 may be omitted depending on the design.

The encapsulation substrate 150 is disposed on the light emitting diode 130 so as to be opposite to the substrate 110. The encapsulation substrate 150 protects the light emitting diode 130 from the external shock and suppresses the permeation of foreign materials, moisture, or oxygen. The encapsulation substrate 150 may be formed of a metal material, which has a high corrosion resistance and is easily processed in the form of a foil or a thin film, such as aluminum (Al), nickel (Ni), chromium (Cr), and an alloy material of iron (Fe) and nickel. Therefore, as the encapsulation substrate 150 is formed of a metal material, the encapsulation substrate 150 may be implemented as an ultra-thin film and provide a strong resistance against external impacts and scratches.

The adhesive layer 116 fills the space between the capping layer 140 and the encapsulation substrate 150 and bonds the substrate 110 and the encapsulation substrate 150. The adhesive layer 116 may include adhesive resin and a hygroscopic filler. The adhesive resin of the adhesive layer 116 is formed of a material having adhesiveness and may be a thermo-setting or natural curable adhesive and for example, may be optical clear adhesive or pressure sensitive adhesive, but is not limited thereto. The hygroscopic filler of the adhesive layer 116 absorbs oxygen or moisture to delay the oxidation and deterioration of the light emitting diode 130.

In the meantime, the display device 100 may further dispose an additional encapsulation unit between the light emitting diode 130 and the adhesive layer 116. The encapsulation unit 150 is formed of a single or a double layered inorganic encapsulation layer and formed with a structure in which the inorganic encapsulation layer and the organic encapsulation layer are alternately laminated.

Figure 3:
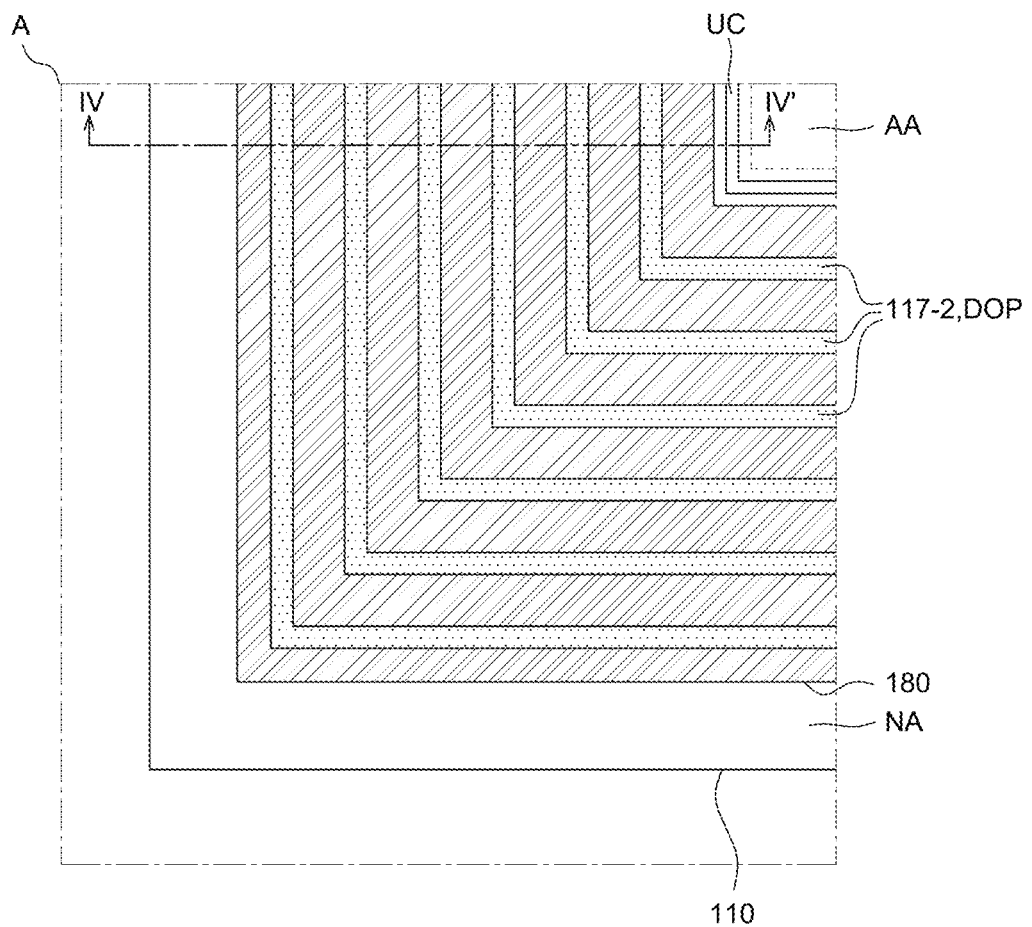
FIG. 3 is a schematic enlarged plan view of an area A of FIG. 1.
Figure 4:
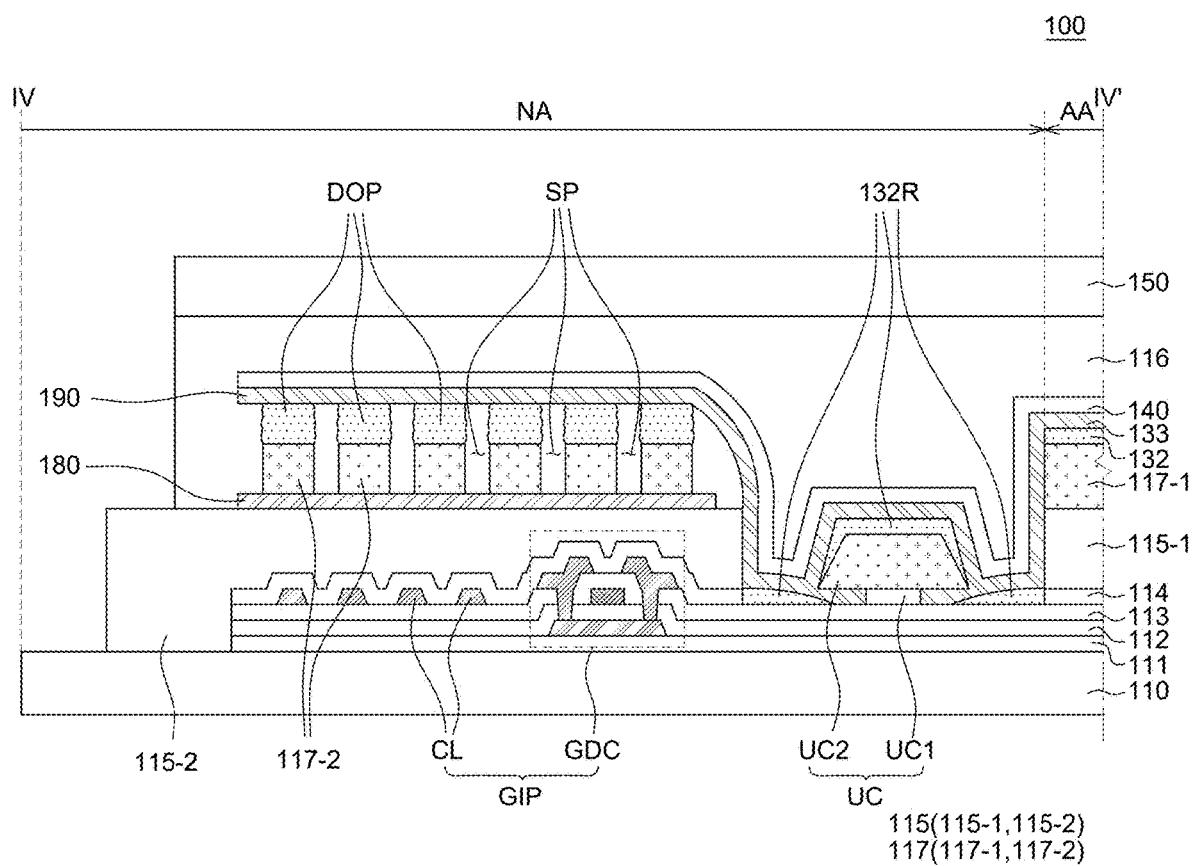
FIG. 4 is a cross-sectional view taken along IV-IV' of FIG. 3.

FIG. 3 is a schematic enlarged plan view of an area A of FIG. 1. FIG. 4 is a cross-sectional view taken along IV-IV' of FIG. 3. In FIG. 3, for the convenience of description, among various components of the display device 100, only a substrate 110, a first conductive pattern 180, a second bank 117-2, a dummy organic pattern DOP, and an undercut structure UC are illustrated.

Referring to FIGS. 3 and 4, the display device 100 further includes a gate driver GIP, a second planarizing layer 115-2, a second bank 117-2, an undercut structure UC, a first conductive pattern 180, a second conductive pattern 190, and a dummy organic pattern DOP.

In the non-active area NA, the buffer layer 111 is disposed on the substrate 110 and the gate driver GIP is disposed on the buffer layer 111. The gate driver GIP includes a gate driver circuit GDC and a plurality of signal lines CL.

The gate driver circuit GDC is disposed on the buffer layer 111. Even though the gate driver circuit GDC is configured by a transistor or a capacitor, in FIG. 4, for the convenience of description, the gate driver circuit is illustrated as a transistor.

Each of the plurality of signal lines CL may be a clock signal line or a start signal line. The plurality of signal lines CL may be formed of the same material on the same layer as the source electrode 122 and the drain electrode 123 of the transistor 120, but is not limited thereto.

A passivation layer is disposed in the non-active area NA so as to cover the gate driver GIP and the interlayer insulating layer 113. In the non-active area NA in which the gate driver GIP is disposed, the second planarizing layer 115-2 is disposed on the passivation layer 114. The second planarizing layer 115-2 may be an organic material layer which planarizes an upper portion of the gate driver GIP. For example, the second planarizing layer 115-2 may be formed of an organic material such as acryl resin, epoxy resin, phenolic resin, polyamide resin, or polyimide resin, but is not limited thereto. Further, the second planarizing layer 115-2 may be formed of the same material as the first planarizing layer 115-1. Therefore, the planarizing layer 115 of the display device 100 may include the first planarizing layer 115-1 disposed in the active area AA and the second planarizing layer 115-2 which is spaced apart from the first planarizing layer 115-1 and is disposed in the non-active area NA.

The undercut structure is disposed in the non-active area NA to be closer to the active area AA than the first conductive pattern 180. The undercut structure UC is a structure in which the organic light emitting layer 132 disposed in the active area AA extends to the non-active area NA to block the moisture permeation. The undercut structure UC is disposed between the first planarizing layer 115-1 and the second planarizing layer 115-2. Further, the undercut structure UC is disposed in the non-active area NA so as to enclose the active area AA.

The undercut structure UC includes a first layer UC1 and a second layer UC2 on the first layer UC1. The first layer UC1 is disposed on the interlayer insulating layer 113 and is formed of the same material as the passivation layer 114. The second layer UC2 is disposed on the first layer UC1 and is formed of the same material as the first bank 117-1. A lower surface of the second layer UC2 is larger than an upper surface of the first layer UC1. The undercut structure UC suppresses the organic light emitting layer 132 of the active area AA from extending to the non-active area NA, specifically, to an end of the non-active area NA by the placement of the first layer UC1 and the second layer UC2. The plurality of dummy organic patterns DOP to be described below and the organic light emitting layer 132 are separated by the undercut structure UC. At this time, a remaining organic material 132R formed of the same material as the organic light emitting layer 132 is disposed in an upper portion of the undercut structure UC, a left side and a right side of the undercut structure UC. As described above, the organic light emitting layer 132 and the plurality of dummy organic patterns DOP are separated by the undercut structure UC, but the cathode 133, the second conductive pattern 190, and the capping layer 140 to be described below may not be separated by the undercut structure UC.

In the non-active area NA, a first conductive pattern 180 is disposed on the second planarizing layer 115-2. The first conductive pattern 180 is disposed to enclose an area on the second planarizing layer 115-2 on which the undercut structure UC is disposed. The first conductive pattern 180 may be disposed as a single layer. The first conductive pattern 180 is formed of the same material as the anode 131. That is, the anode 131 disposed on the first planarizing layer 115-1 and the first conductive pattern 180 disposed on the second planarizing layer 115-2 are simultaneously formed of the same material. The first conductive pattern 180 and the anode 131 are formed of the same material, but the first conductive pattern 180 is electrically isolated from the anode 131. That is, a voltage applied to the anode 131 and a voltage applied to the first conductive pattern 180 are separately applied.

The second bank 117-2 is disposed on the first conductive pattern 180. The second bank 117-2 is disposed on the planarizing layer 115 and the first conductive pattern 180 in the non-active area NA. The second bank 117-2 is formed of the same material as the first bank 117-1. That is, the first bank 117-1 and the second bank 117-2 are simultaneously formed of the same material. Therefore, the bank 117 includes a first bank 117-1 disposed in the active area AA and a second bank 117-2 disposed in the non-active area NA.

The second bank 117-2 includes a plurality of closed curve patterns which encloses the active area AA. That is, the plurality of closed curve patterns of the second bank 117-2 is disposed in the non-active area NA so as to enclose the active area AA. In FIGS. 3 and 4, even though it is illustrated that the plurality of closed curve patterns of the second bank 117-2 is six, the number of closed curve patterns is not limited thereto.

The plurality of dummy organic patterns DOP is disposed on the second bank 117-2. That is, the plurality of dummy organic patterns DOP is disposed on the second bank 117-2 and the first conductive pattern 180. The plurality of dummy organic patterns DOP is formed of the same material as the organic light emitting layer 132, simultaneously. That is, the plurality of dummy organic patterns DOP and the organic light emitting layer 132 are simultaneously formed of the same material.

The plurality of dummy organic patterns DOP may have a closed curve shape which encloses the active area AA. That is, the plurality of dummy organic patterns DOP is disposed in the non-active area NA so as to enclose the active area AA. Even though in FIGS. 3 and 4, it is illustrated that the plurality of dummy organic patterns DOP is six, the number is not limited thereto.

Side surfaces of the plurality of dummy organic patterns DOP have an uneven structure. At this time, the uneven structure of the side surfaces of the plurality of dummy organic patterns DOP has an irregular shape. That is, the side surfaces of the plurality of dummy organic patterns DOP have a random shape and a surface thereof is not smooth, and may have an uneven shape.

The second conductive pattern 190 is disposed on the plurality of dummy organic patterns DOP. The second conductive pattern 190 is disposed on the first conductive pattern 180, the second bank 117-2, and the plurality of dummy organic patterns DOP. The second conductive pattern 190 is integrally formed of the same material as the cathode 133. That is, the cathode 133 disposed on the first planarizing layer 115-1 and the second conductive pattern 190 disposed on the second planarizing layer 115-2 are simultaneously formed of the same material. The second conductive pattern 190 and the cathode 133 are integrally formed without being separated by the undercut structure UC. That is, the cathode 133 and the second conductive pattern 190 may be one layer. At this time, a part disposed in the active area AA is defined as the cathode 133 and a part disposed in the non-active area NA is defined as the second conductive pattern 190, but is not limited thereto.

When an organic light emitting layer is formed, a mask in which an area corresponding to the active area is fully open is used. That is, the organic light emitting layer is formed by depositing an organic material using a mask in which the area corresponding to the active area is fully open. At this time, a shadow phenomenon in which the organic material is not only deposited in an area corresponding to the open area of the mask, is but also partially deposited in the non-active area may occur. At this time, when the organic light emitting layer is disposed in the non-active area, the moisture may easily permeate from the side surface of the display device. That is, when the moisture permeates from the organic light emitting layer disposed in the non-active area to the organic light emitting layer disposed in the active area, the performance of the organic light emitting layer is deteriorated and the reliability and the lifespan of the display device are reduced. Specifically, in the case of the display device in which a non-active area is minimized to reduce a bezel area, the moisture permeation path is very short so that the problem caused by the moisture permeation may be more serious. In order to solve the above-described problem, it is considered that the organic light emitting layer is formed only in the active area. However, the shadow phenomenon cannot be suppressed so that it is not possible to fundamentally block the deposition of the organic material in the non-active area.

Accordingly, in the display device 100 according to the exemplary embodiment of the present disclosure, the organic material deposited in the non-active area NA is partially removed to block the moisture permeation path from the side surface. To be more specific, the organic material is continuously disposed to a portion in which the outermost part of the plurality of dummy organic patterns DOP is disposed so that the organic light emitting layer 132 disposed in the active area AA is disposed to be continuous to the non-active area NA. However, when the display device 100 according to the exemplary embodiment of the present disclosure is manufactured, a voltage difference applied to the first conductive pattern 180 and the second conductive pattern 190 is increased to remove an organic material disposed between the first conductive pattern 180 and the second conductive pattern 190. That is, when the voltage difference applied to the first conductive pattern 180 and the second conductive pattern 190 is increased in an area excluding an area in which the second bank 117-2 is disposed, in the organic material disposed on the first conductive pattern 180, an arcing phenomenon occurs. Therefore, in an area in which the second bank 117-2 is not disposed, an organic material disposed between the first conductive pattern 180 and the second conductive pattern 190 is removed and as illustrated in FIG. 4, a plurality of dummy organic patterns DOP is formed. For example, when 0 V is applied to the second conductive pattern 190, 50 V may be applied to the first conductive pattern 180, but the voltage value is not limited thereto. As described above, when the organic material is removed, an air gap SP is disposed between the plurality of dummy organic patterns DOP. That is, the air gap SP may be a space defined by the first conductive pattern 180, the second conductive pattern 190, the second bank 117-2, and the plurality of dummy organic patterns DOP. Therefore, on the plane, the plurality of dummy organic patterns DOP is disposed to be spaced apart from each other and the air gap SP may be disposed between the plurality of closed curve patterns of the second bank 117-2. Accordingly, in the display device 100 according to the exemplary embodiment of the present disclosure, the moisture permeating from the side surface through the plurality of dummy organic patterns DOP may be blocked by the air gap SP. Therefore, the moisture permeation path is blocked, the reliability of the display device 100 is improved, and the lifespan is increased.

Further, in the display device 100 according to the exemplary embodiment of the present disclosure, the undercut structure UC is disposed between the first planarizing layer 115-1 and the second planarizing layer 115-2 to separate the organic material from the undercut structure UC. That is, an area of the lower surface of the second layer UC2 is larger than an area of the first layer UC1 of the undercut structure UC so that the organic material may not be continuously deposited by the undercut structure UC. Therefore, the organic light emitting layer 132 disposed in the active area AA and the plurality of dummy organic patterns DOP disposed in the non-active area NA are separated. Accordingly, in the display device 100 according to the exemplary embodiment of the present disclosure, the plurality of dummy organic patterns DOP and the organic light emitting layer 132 are separated from the side surface. Therefore, the moisture permeation path through the dummy organic pattern DOP is additionally blocked, the reliability of the display device 100 is improved, and the lifespan is increased.

Figure 5:
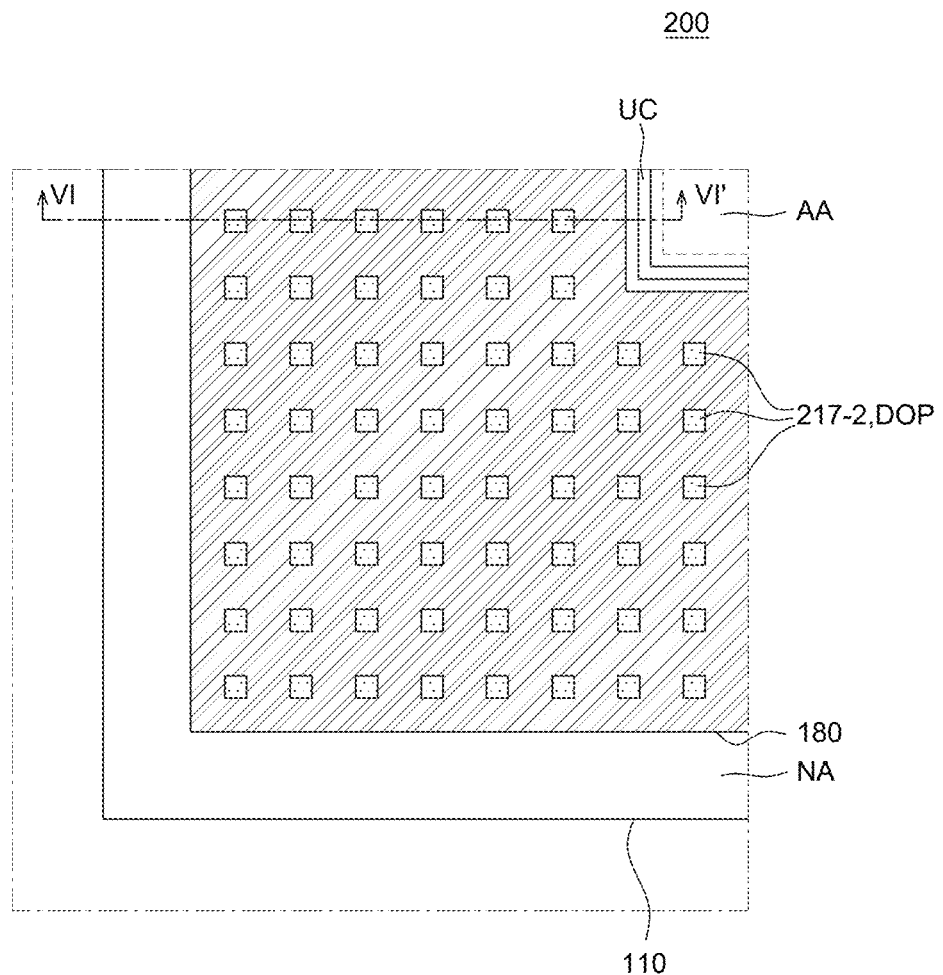
FIG. 5 is a schematic enlarged plan view of a display device according to another exemplary embodiment of the present disclosure.
Figure 6:
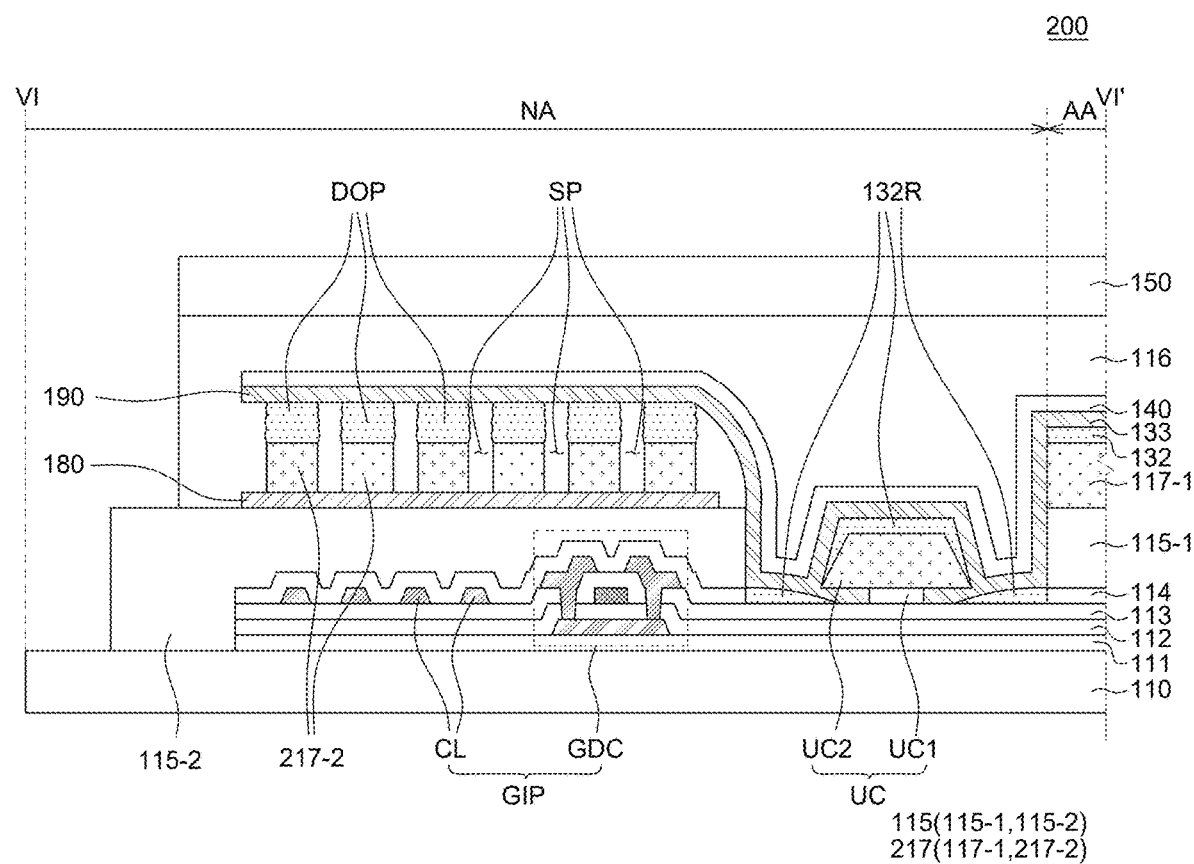
FIG. 6 is a cross-sectional view taken along the line VI-VI' of FIG. 5.

FIG. 5 is a schematic enlarged plan view of a display device according to another exemplary embodiment of the present disclosure. FIG. 6 is a cross-sectional view taken along the line VI-VI' of FIG. 5. The only difference between a display device 200 of FIGS. 5 to 6 and the display device 100 of FIGS. 1 to 4 is a bank 217 and a dummy organic pattern, but the other configurations are substantially the same, so that a redundant description will be omitted.

Referring to FIGS. 5 and 6, a bank 217 includes a first bank 117-1 disposed in the active area AA and a second bank 217-2 disposed in the non-active area NA. At this time, the second bank 217-2 is disposed on the first conductive pattern 180. The second bank 217-2 is disposed on the planarizing layer 115 and the first conductive pattern 180 in the non-active area NA. The second bank 217-2 is formed of the same material as the first bank 117-1. That is, the first bank 117-1 and the second bank 217-2 are simultaneously formed of the same material.

The second bank 217-2 includes a plurality of dot patterns which encloses the active area AA. The plurality of dot patterns of the second bank 217-2 may be disposed in a matrix.

The plurality of dummy organic patterns DOP is disposed on the second bank 217-2. That is, the plurality of dummy organic patterns DOP is disposed on the second bank 217-2 and the first conductive pattern 180. The plurality of dummy organic patterns DOP and the organic light emitting layer 132 are simultaneously formed of the same material. That is, the plurality of dummy organic patterns DOP and the organic light emitting layer 132 are simultaneously formed of the same material.

The plurality of dummy organic patterns DOP may include a plurality of dot patterns. That is, the plurality of dot patterns of the second bank 217-2 may be disposed in a matrix.

Side surfaces of the plurality of dummy organic patterns DOP have an uneven structure. At this time, the uneven structure of the side surfaces of the plurality of dummy organic patterns DOP has an irregular shape. That is, the side surfaces of the plurality of dummy organic patterns DOP have a random shape and a surface thereof is not smooth, and may have an uneven shape.

In the display device 200 according to another exemplary embodiment of the present disclosure, the organic material deposited in the non-active area NA is partially removed to block the moisture permeation path from the side surface. Therefore, an air gap SP is disposed between the plurality of dummy organic patterns DOP from which the organic material is removed. That is, the air gap SP is disposed so as to enclose the plurality of dummy organic patterns DOP which forms the plurality of dot patterns and the second bank 217-2. Therefore, an area of the non-active area NA occupied by the dummy organic pattern DOP is reduced and the dummy organic pattern DOP is completely enclosed by the air gap SP. Accordingly, in the display device 200 according to another exemplary embodiment of the present disclosure, the dummy organic pattern DOP is completely enclosed by the air gap SP so that the moisture permeation path is more completely cut. Therefore, the moisture which permeates through the plurality of dummy organic patterns DOP from the side surface may be blocked by the air gap SP. Therefore, the moisture permeation path is blocked, the reliability of the display device 200 is improved, and the lifespan is increased.

Further, in the display device 200 according to another exemplary embodiment of the present disclosure, the undercut structure UC is disposed between the first planarizing layer 115-1 and the second planarizing layer 115-2 to separate the organic material from the undercut structure UC. That is, the organic light emitting layer 132 disposed in the active area AA and the plurality of dummy organic patterns DOP disposed in the non-active area NA are separated. Accordingly, in the display device 200 according to another exemplary embodiment of the present disclosure, the plurality of dummy organic patterns DOP and the organic light emitting layer 132 are separated from the side surface. Therefore, the moisture permeation path through the dummy organic pattern DOP is additionally blocked, the reliability of the display device 200 is improved, and the lifespan is increased.

Figure 7:
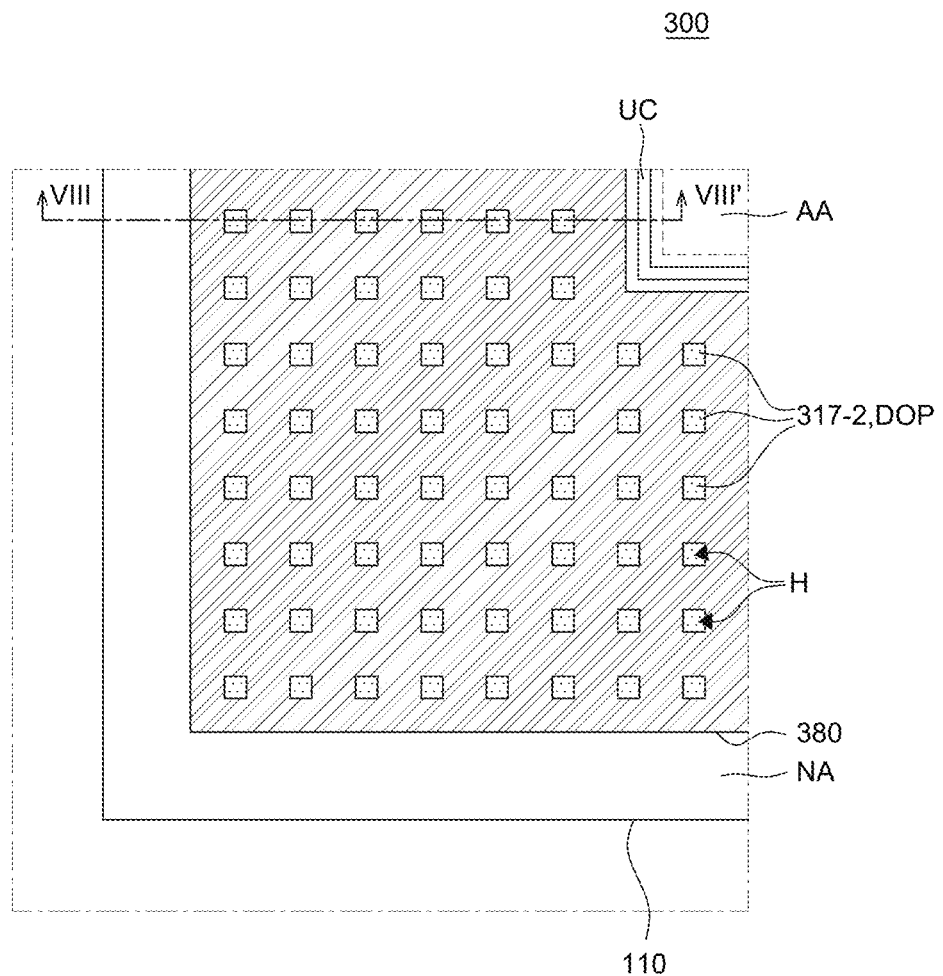
FIG. 7 is a schematic enlarged plan view of a display device according to still another exemplary embodiment of the present disclosure.
Figure 8:
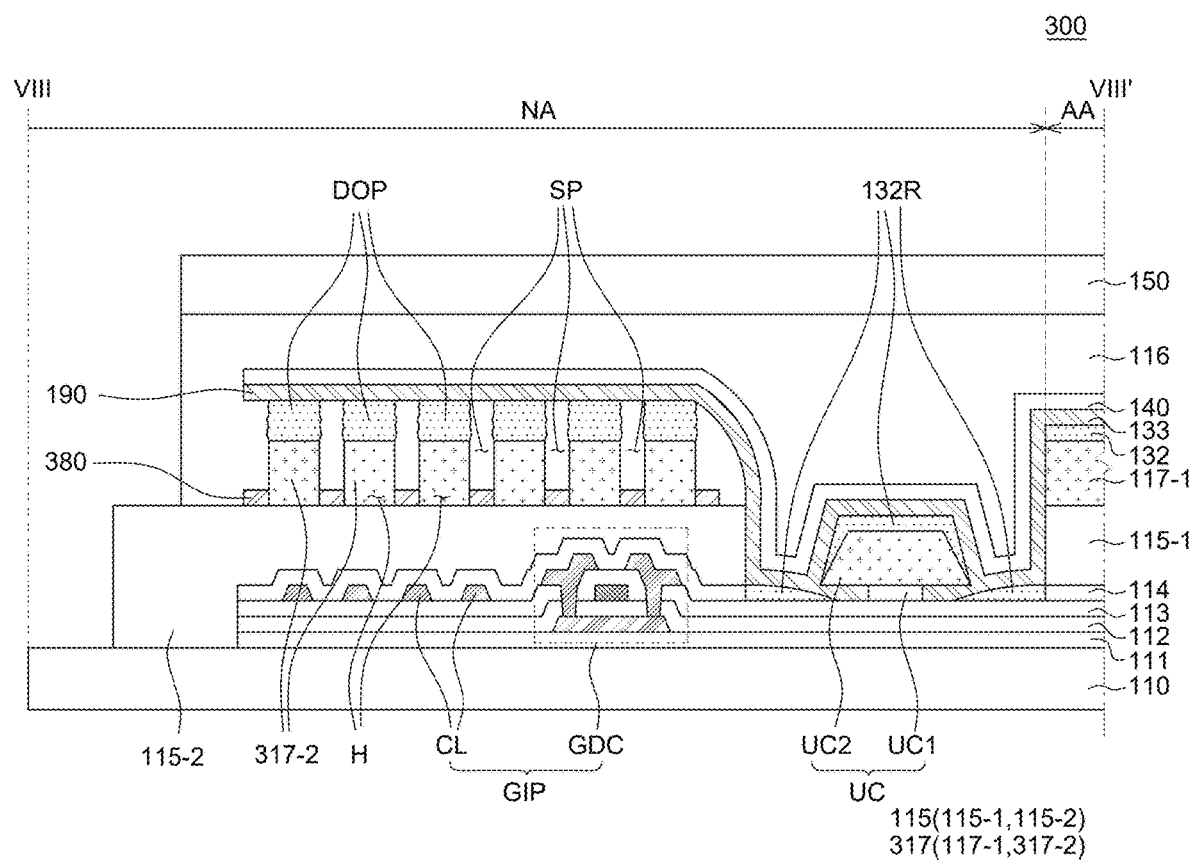
FIG. 8 is a cross-sectional view taken along the line VIII-VIII' of FIG. 7.

FIG. 7 is a schematic enlarged plan view of a display device according to still another exemplary embodiment of the present disclosure. FIG. 8 is a cross-sectional view taken along the line VIII-VIII' of FIG. 7. The only difference between the display device 300 of FIGS. 7 and 8 and the display device 200 of FIGS. 5 and 6 is a first conductive pattern 380 and a bank 317, but the other components are substantially the same so that a redundant description will be omitted.

Referring to FIGS. 7 and 8, in the non-active area NA, a first conductive pattern 380 is disposed on the second planarizing layer 115-2. The first conductive pattern 380 has a lattice pattern structure in which a plurality of holes H is disposed. That is, the first conductive pattern 380 may have a mesh pattern. The first conductive pattern 380 is formed of the same material as the anode 131. That is, the anode 131 disposed on the first planarizing layer 115-1 and the first conductive pattern 380 disposed on the second planarizing layer 115-2 are simultaneously formed of the same material. The first conductive pattern 380 and the anode 131 are formed of the same material, but the first conductive pattern 380 is electrically isolated from the anode 131.

The bank 317 includes a first bank 117-1 disposed in the active area AA and a second bank 317-2 disposed in the non-active area NA. The second bank 317-2 is disposed on the second planarizing layer 115-2 in the non-active area NA. At this time, the second bank 317-2 is disposed in the plurality of holes H of the first conductive pattern 380. In FIGS. 7 and 8, it is illustrated that the second bank 317-2 is accurately disposed in the plurality of holes H of the first conductive pattern 380. However, the second bank 317-2 may be disposed in only some of the plurality of holes H of the first conductive pattern 380 or disposed on only the hole H of the first conductive pattern 380 and a partial area of the first conductive pattern 380. The second bank 317-2 is formed of the same material as the first bank 117-1. That is, the first bank 117-1 and the second bank 317-2 are simultaneously formed of the same material.

The second bank 317-2 includes a plurality of dot patterns which encloses the active area AA. That is, the plurality of dot patterns of the second bank 317-2 may be disposed in a matrix.

The plurality of dummy organic patterns DOP is disposed on the second bank 317-2. The plurality of dummy organic patterns DOP is simultaneously formed of the same material as the organic light emitting layer 132. That is, the plurality of dummy organic patterns DOP and the organic light emitting layer 132 are simultaneously formed of the same material.

The plurality of dummy organic patterns DOP may include a plurality of dot patterns. That is, the plurality of dot patterns of the second bank 317-2 may be disposed in a matrix.

Side surfaces of the plurality of dummy organic patterns DOP have an uneven structure. At this time, the uneven structure of the side surfaces of the plurality of dummy organic patterns DOP has an irregular shape. That is, the side surfaces of the plurality of dummy organic patterns DOP have a random shape and a surface thereof is not smooth, and may have an uneven shape.

In the display device 300 according to still another exemplary embodiment of the present disclosure, the organic material deposited in the non-active area NA is partially removed to block the moisture permeation path from the side surface. Therefore, an air gap SP is disposed between the plurality of dummy organic patterns DOP from which the organic material is removed. That is, the air gap SP is disposed so as to enclose the plurality of dummy organic patterns DOP which forms the plurality of dot patterns and the second bank 317-2. Therefore, an area of the non-active area NA occupied by the dummy organic pattern DOP is reduced and the dummy organic pattern DOP is completely enclosed by the air gap SP. Accordingly, in the display device 300 according to still another exemplary embodiment of the present disclosure, the dummy organic pattern DOP is completely enclosed by the air gap SP so that the moisture permeation path is more completely cut. Therefore, the moisture which permeates through the plurality of dummy organic patterns DOP from the side surface may be blocked by the air gap SP. Therefore, the moisture permeation path is blocked, the reliability of the display device 300 is improved, and the lifespan is increased.

Further, the plurality of holes H is formed in the first conductive pattern 380 to effectively discharge outgas generated in the second planarizing layer 115-2 during the thermal treatment process after forming the first conductive pattern 380 through the plurality of holes H. Therefore, the degradation of the reliability of the display device 300 caused by the outgas generated in the second planarizing layer 115-2 may be suppressed.

Further, in the display device 300 according to still another exemplary embodiment of the present disclosure, the undercut structure UC is disposed between the first planarizing layer 115-1 and the second planarizing layer 115-2 to separate the organic material from the undercut structure UC. That is, the organic light emitting layer 132 disposed in the active area AA and the plurality of dummy organic patterns DOP disposed in the non-active area NA are separated. Accordingly, in the display device 300 according to still another exemplary embodiment of the present disclosure, the plurality of dummy organic patterns DOP and the organic light emitting layer 132 are separated from the side surface. Therefore, the moisture permeation path through the dummy organic pattern DOP is additionally blocked, the reliability of the display device 300 is improved, and the lifespan is increased.

The exemplary embodiments of the present disclosure can also be described as follows:

According to an aspect of the present disclosure, there is provided a display device. The display device includes a substrate including an active area and a non-active area which encloses the active area, a transistor on the substrate in the active area, a planarizing layer on the substrate and the transistor in the active area and the non-active area, a light emitting diode which is on the planarizing layer in the active area and includes an anode, an organic light emitting layer, and a cathode, a first conductive pattern on the planarizing layer in the non-active area, a second conductive pattern on the first conductive pattern in the non-active area and a plurality of dummy organic patterns which is disposed between the first conductive pattern and the second conductive pattern and is formed of the same material as the organic light emitting layer, wherein an air gap is disposed between the plurality of dummy organic patterns.

The display device may further include a first bank disposed in the active area so as to cover an end of the anode and a second bank which is disposed on the planarizing layer in the non-active area and is formed of the same material as the first bank, wherein the plurality of dummy organic patterns is disposed on the second bank.

The plurality of dummy organic patterns may be disposed on the first conductive pattern.

The first conductive pattern has a lattice pattern structure in which a plurality of holes may be disposed, and the second bank may be disposed in the plurality of holes.

The air gap may be defined by the first conductive pattern, the second conductive pattern, the second bank, and the plurality of dummy organic patterns.

The second bank may include a plurality of closed curve patterns which encloses the active area, and the air gap may be disposed between the plurality of closed curve patterns.

The second bank may include a plurality of dot patterns and the air gap may be disposed so as to enclose the plurality of dot patterns.

The side surfaces of the plurality of dummy organic patterns have an uneven structure.

The uneven structure has an irregular shape.

The display device may further include an undercut structure which may be disposed in the non-active area to be closer to the active area than the first conductive pattern, wherein the planarizing layer may include a first planarizing layer disposed in the active area and a second planarizing layer which is spaced apart from the first planarizing layer and may be disposed in the non-active area, and the undercut structure may be disposed between the first planarizing layer and the second planarizing layer.

The undercut structure may include a first layer and a second layer having a lower surface larger than an upper surface of the first layer, and the organic light emitting layer and the plurality of dummy organic patterns may be separated by the undercut structure.

The first conductive pattern may be formed of the same material as the anode and may be electrically isolated from the anode.

The second conductive pattern may be formed of the same material as the cathode and may be integrally formed with the cathode.

According to another aspect of the present disclosure, there is provided a display device. The display device includes a substrate including an active area and a non-active area which encloses the active area, a transistor on the substrate in the active area, a planarizing layer on the substrate and the transistor in the active area and the non-active area, a light emitting diode which is on the planarizing layer in the active area and includes an anode, an organic light emitting layer, and a cathode, a first conductive pattern on the planarizing layer in the non-active area, a second conductive pattern on the first conductive pattern in the non-active area and an undercut structure which is disposed in the non-active area to be closer to the active area than the first conductive pattern, wherein the planarizing layer includes a first planarizing layer disposed in the active area and a second planarizing layer which is spaced apart from the first planarizing layer and is disposed in the non-active area, and the undercut structure is disposed between the first planarizing layer and the second planarizing layer.

The display device may further include a plurality of dummy organic patterns which is disposed between the first conductive pattern and the second conductive pattern and is formed of the same material as the organic light emitting layer, wherein an air gap is disposed between the plurality of dummy organic patterns.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a substrate including an active area and a non-active area which encloses the active area;
   a transistor on the substrate in the active area;
   a planarizing layer on the substrate and the transistor in the active area and the non-active area;
   a light emitting diode which is on the planarizing layer in the active area and includes an anode, an organic light emitting layer, and a cathode;
   a first conductive pattern on the planarizing layer in the non-active area;
   a second conductive pattern on the first conductive pattern in the non-active area; and
   a plurality of dummy organic patterns which is disposed between the first conductive pattern and the second conductive pattern and is formed of the same material as the organic light emitting layer,
   wherein an air gap is disposed between the plurality of dummy organic patterns.

2. The display device according to claim 1, further comprising:
   a first bank disposed in the active area so as to cover an end of the anode; and
   a second bank which is disposed on the planarizing layer in the non-active area and is formed of the same material as the first bank,
   wherein the plurality of dummy organic patterns is disposed on the second bank.

3. The display device according to claim 2, wherein the plurality of dummy organic patterns is disposed on the first conductive pattern.

4. The display device according to claim 2, wherein the first conductive pattern has a lattice pattern structure in which a plurality of holes is disposed and the second bank is disposed in the plurality of holes.

5. The display device according to claim 2, wherein the air gap is defined by the first conductive pattern, the second conductive pattern, the second bank, and the plurality of dummy organic patterns.

6. The display device according to claim 2, wherein the second bank includes a plurality of closed curve patterns which encloses the active area and the air gap is disposed between the plurality of closed curve patterns.

7. The display device according to claim 2, wherein the second bank includes a plurality of dot patterns and the air gap is disposed so as to enclose the plurality of dot patterns.

8. The display device according to claim 1, wherein side surfaces of the plurality of dummy organic patterns have an uneven structure.

9. The display device according to claim 8, wherein the uneven structure has an irregular shape.

10. The display device according to claim 1, further comprising:

an undercut structure which is disposed in the non-active area to be closer to the active area than the first conductive pattern, wherein the planarizing layer includes a first planarizing layer disposed in the active area and a second planarizing layer which is spaced apart from the first planarizing layer and is disposed in the non-active area, and the undercut structure is disposed between the first planarizing layer and the second planarizing layer.

11. The display device according to claim 10, wherein the undercut structure includes a first layer and a second layer having a lower surface larger than an upper surface of the first layer, and the organic light emitting layer and the plurality of dummy organic patterns are separated by the undercut structure.

12. The display device according to claim 1, wherein the first conductive pattern is formed of the same material as the anode and is electrically isolated from the anode.

13. The display device according to claim 1, wherein the second conductive pattern is formed of the same material as the cathode and is integrally formed with the cathode.

14. A display device, comprising:
a substrate including an active area and a non-active area which encloses the active area;
a transistor on the substrate in the active area;
a planarizing layer on the substrate and the transistor in the active area and the non-active area;
a light emitting diode which is on the planarizing layer in the active area and includes an anode, an organic light emitting layer, and a cathode;
a first conductive pattern on the planarizing layer in the non-active area;
a second conductive pattern on the first conductive pattern in the non-active area; and
an undercut structure which is disposed in the non-active area to be closer to the active area than the first conductive pattern,
wherein the planarizing layer includes a first planarizing layer disposed in the active area and a second planarizing layer which is spaced apart from the first planarizing layer and is disposed in the non-active area, and the undercut structure is disposed between the first planarizing layer and the second planarizing layer.

15. The display device according to claim 14, further comprising:
a plurality of dummy organic patterns which is disposed between the first conductive pattern and the second conductive pattern and is formed of the same material as the organic light emitting layer,
wherein an air gap is disposed between the plurality of dummy organic patterns.

* * * * *